(12) United States Patent
Chuang et al.

(10) Patent No.: US 7,187,500 B2
(45) Date of Patent: Mar. 6, 2007

(54) PEAK POWER AND SPECKLE CONTRAST REDUCTION FOR A SINGLE LAYER PULSE

(75) Inventors: Yung-Ho Chuang, Cupertino, CA (US); J. Joseph Armstrong, Milpitas, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 199 days.

(21) Appl. No.: 10/776,562

(22) Filed: Feb. 10, 2004

(65) Prior Publication Data

US 2004/0165621 A1 Aug. 26, 2004

Related U.S. Application Data

(63) Continuation of application No. 09/737,024, filed on Dec. 12, 2000, now Pat. No. 6,693,930.

(51) Int. Cl.
*G02B 27/10* (2006.01)
*G02B 27/14* (2006.01)

(52) U.S. Cl. ........................ 359/618; 359/636
(58) Field of Classification Search ................ 359/618, 359/629–636, 639–641
See application file for complete search history.

(56) References Cited

U.S. PATENT DOCUMENTS

| | | | |
|---|---|---|---|
| 4,155,630 A | 5/1979 | Ih | |
| 4,511,220 A | 4/1985 | Scully | |
| 4,647,158 A | 3/1987 | Yeadon | |
| 5,162,939 A | 11/1992 | Herron et al. | |
| 5,233,460 A | 8/1993 | Partlo et al. | |
| 5,264,912 A | 11/1993 | Vaught et al. | |
| 5,274,494 A | 12/1993 | Rafanelli et al. | |
| 5,309,456 A | 5/1994 | Horton | |
| 5,337,170 A | 8/1994 | Khoury et al. | |
| 5,434,662 A | 7/1995 | Rockwell et al. | |
| 5,621,529 A | 4/1997 | Gordon et al. | |
| 5,729,374 A | 3/1998 | Tiszauer et al. | |
| 5,808,797 A | 9/1998 | Bloom et al. | |
| 5,849,468 A | 12/1998 | Sawyer | |
| 5,851,740 A | 12/1998 | Sawyer | |
| 5,990,983 A | 11/1999 | Hargis et al. | |
| 6,191,887 B1 | 2/2001 | Michaloski et al. | |
| 6,275,514 B1 | 8/2001 | Katzir et al. | |
| 6,370,178 B1 | 4/2002 | Papayoanou et al. | |
| 2004/0095573 A1* | 5/2004 | Tsai et al. ................. | 356/237.5 |

* cited by examiner

*Primary Examiner*—Alicia M Harrington
(74) *Attorney, Agent, or Firm*—Smyrski Law Group, A P.C.

(57) ABSTRACT

A system and method for reducing peak power of a laser pulse and reducing speckle contrast of a single pulse comprises a plurality of elements oriented to split and delay a pulse or pulses transmitted from a light emitting device. The design provides the ability to divide the pulse into multiple pulses by delaying the components relative to one another. Reduction of speckle contrast entails using the same or similar components to the power reduction design, reoriented to orient received energy wherein angles between the optical paths are altered such that the split or divided light energy components strike the target at different angles or different positions. An alternate embodiment for reducing speckle contrast is disclosed wherein a single pulse is passed in an angular orientation through a grating to create a delayed portion of the pulse relative to the leading edge of the pulse.

20 Claims, 9 Drawing Sheets

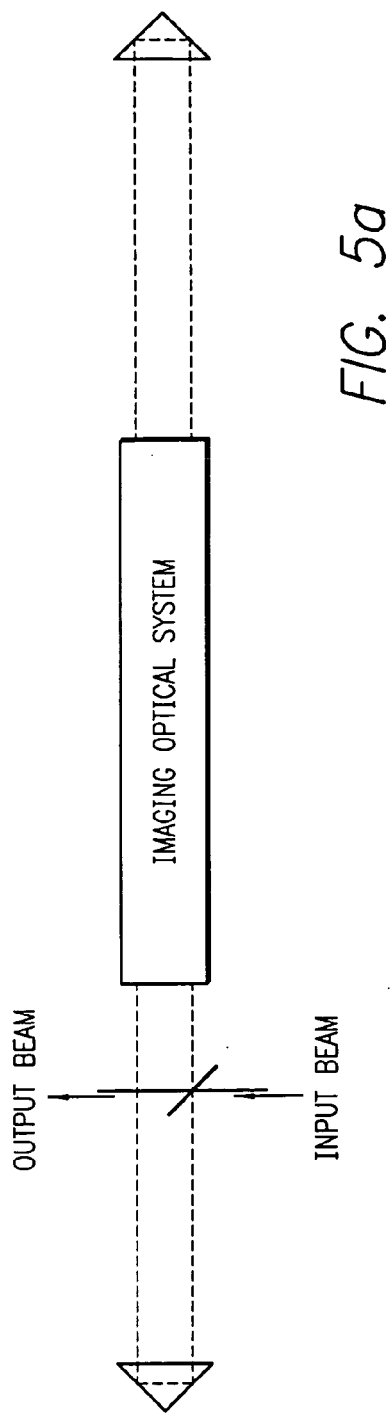
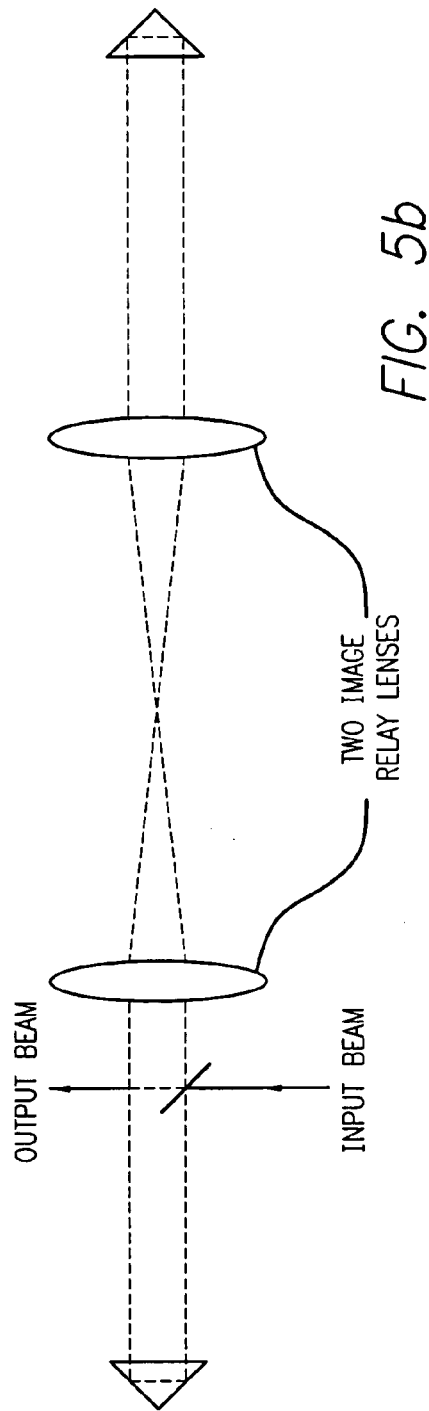
FIG. 5a
FIG. 5b

PEAK POWER AND SPECKLE CONTRAST REDUCTION FOR A SINGLE LAYER PULSE

BACKGROUND OF THE INVENTION

1. Field of the Invention

The present invention relates generally to the field of optical imaging and more particularly to reduction of the peak power and speckle contrast for bright field and dark field inspection applications.

2. Description of the Related Art

Many optical systems are designed to produce images such as an inspection system for a partially fabricated integrated circuit or a photomask. Techniques and apparatus for inspecting circuits or photomasks are well known in the art and are embodied in various commercial products such as many of those available from KLA-Tencor Corporation of San Jose, Calif. Most optical imaging systems use a continuous illumination source. However, many times pulsed illumination sources are preferred or are the only sources available. This is especially true in the DUV spectral region below 250 nm where very few high brightness illumination sources exist that are not pulsed. Common examples are excimer lasers used in the photolithography process for manufacturing semiconductor devices.

If a pulsed illumination source is used, the optical imaging system must contend with the nature of pulsed illumination. This is especially true when inspecting integrated circuits or photomasks. Pulsed illumination typically suffers from two major problems. First, the peak power of the illumination transmitted from the illumination source can be very high and potentially damage elements in the optical system or the object being inspected. Second, the light energy can suffer from "speckle" or random intensity distribution of light due to interference effects. This is especially true for laser light sources.

Further, instances occur wherein a higher repetition rate source is not available. A system or device for turning a high repetition rate laser, such as a mode locked laser, into a virtually continuous source would be very useful in these situations.

One prior apparatus for reducing the peak power of a pulsed laser is U.S. Pat. No. 5,309,456 by Horton. The Horton design uses one mirror and one beamsplitter to split a single laser pulse into multiple pulses. The multiple pulses are then delayed with respect to each other using reflective optical delay schemes. Several drawbacks exist for this approach. First, the pulse-to-pulse uniformity is highly dependent on the quality of the mirror and beamsplitter used to form the multiple pulses as well as losses in the optical delay schemes. To maintain uniform pulses this system requires 100% reflective mirrors, 50% reflective and 50% transmissive beam splitters with no absorption, and perfect AR coatings with 100% transmission. Any deviations from this will cause an energy variation between the pulses. For example, consider the effects of imperfect optics on a system that generates 16 pulses. If the beamsplitter transmission is 49% and the reflectivity is 51%, the energy variation between the pulses will be 16%. In addition, if the mirror has a reflectivity of 99% it will cause an additional energy variation between the pulses of 3%. Another limitation of the Horton design is that it is not well suited for the DUV-VUV spectral range. Reflective coatings are much less efficient in this range and can cause large losses. These losses will contribute to pulse-to-pulse nonuniformity and a reduction in the efficiency of the peak power reduction scheme. For example, a reflective optical delay scheme with a 1 m long cavity, using mirrors with 99% reflectivity, and an optical delay of 10 meters will have a loss of 10%. Similarily, a reflective optical delay scheme with an optical delay of 20 m, 40 m, and 80 m will have losses of 18%, 33%, and 55% respectively. If these delay paths are used in a system to generate 16 pulses, assuming perfect 50% beam splitters and a perfectly reflecting mirror, the lowest energy pulse will be only 22% of the highest energy pulse. An additional limitation of the Horton design is that it uses a single mirror and beamsplitter to generate the multiple pulses. This optical setup is not flexible and inhibits compensation of different losses for each delay path. In addition, this scheme offers no solution for dealing with the effects of speckle.

With respect to speckle problems, two primary techniques have been used in the past to reduce the contrast of speckle in a single laser pulse. The first technique employs two rotating diffusers to create multiple speckle patterns during a single pulse. This technique relies on the relative motion of the two rotating diffusers to produce uncorrrelated speckle patterns. This technique has several major disadvantages. First, the diffusers must rotate at a high at a high rate of speed to produce smoothing within a pulse. For a typical pulse of 20 ns, only a limited number of uncorrelated speckle patterns can be produced. Also, losses from diffusers are typically very high. A typical transmission for such a diffuser is 40%. The diffusers in combination then have a transmission of only 16%. In addition, rotating diffusers can be a source of vibration that can effect the image quality of the system. The second technique uses two diffraction gratings and an electro-optic modulator to produce speckle smoothing within a single pulse. This scheme was developed to minimize speckle problems for laser fusion systems. This technique has several limitations including large size and very high cost. In addition, electro optic modulators operating at high bandwidths in the DUV and VUV ranges are not available.

It is therefore an object of the current invention to provide a system or arrangement that can reduce the peak power of a laser pulse emanating from an energy source.

It is another object of the current invention to provide an illumination solution that does not suffer excessive losses due to mirrors, beamsplitters, and optical delay lines but that can produce substantially uniform pulses.

It is a further object of the current invention to provide an illumination solution that can be readily reconfigured while producing optical delays with minimum optical losses, particularly in the DUV-VUV spectral region.

It is still a further object of the current invention to provide an illumination solution, having reduced speckle contrast for a single energy pulse.

It is yet a further object of the current invention to provide for speckle contrast reduction in an illumination system preferably employing a pulsed illumination source wherein said speckle contrast reduction may be employed in combination with other speckle reduction schemes to further reduce the speckle contrast of a single pulse.

It is yet another object of the current invention to effectively increase the repetition rate of a pulsed source and further to achieve quasi-continuous operation from a high repetition rate source.

SUMMARY OF THE INVENTION

The present invention is a system and method for reducing the peak power of a laser pulse. The system and method disclosed herein utilize multiple paths using a unique design to divide a pulse received from a light generating device, such as a laser, into multiple lower energy pulses, and delay those pulses such that they may strike the target surface at different times. The design provided herein comprises a plurality of beamsplitters combined with a plurality of delay elements to delay a pulse or pulses transmitted from the light emitting device in an advantageous manner. The design provides the ability to readily divide the pulse into two, four, eight, or conceivably any number of components with components delayed relative to one another. The energy in each pulse can be adjusted using a variety of optical attenuation schemes to produce pulses with substantially uniform energies. Energy received from the light generating device may be split into components using beamsplitters and directed through different paths toward the target, such as a semiconductor wafer surface. Certain optical delay arrangements using prisms, Brewster's angle surfaces, and reflecting devices employing mirrors or Total Internal Reflection (TIR) surfaces provide delay compensation for the optical paths. These delay schemes can be in classical arrangements such as a White Cell or Herriott Cell or other novel delay schemes described herein.

The system and method further include a design for reducing speckle contrast, wherein a similar arrangement to that presented for the peak power reduction is employed, using beamsplitters, mirrors, and optical delay arrangements, to reduce the contrast of speckle in a single laser pulse. The reduction in contrast is performed based on the fact that laser beams entering a diffuser at a different angle or position produces a changed speckle pattern leaving the diffuser. Multiple speckle patterns may therefore be generated by multiple beams operating at multiple angles or positions through a diffuser, and the speckle patterns may be integrated together to reduce contrast. However, the speckle pattern must arrive at the detector at slightly different times. Thus the design presented herein to reduce peak power may be used with altered angles between the optical paths such that the split or divided light energy components strike the diffuser at suitably different angles.

An alternate embodiment for reducing speckle contrast is disclosed wherein a single pulse is passed in an angular orientation through a grating to create a delayed portion of the pulse relative to the leading edge of the pulse. One side of the pulse is delayed with respect to the other side of the pulse. If this time delay is suitably longer than the coherence length of the laser pulse, multiple zones are created across the pulse that will not interfere. Each of these zones can then pass through a diffuser at different angles and the speckle contrast can be reduced. A second grating can also be used in combination with the first grating to remove the spectral dispersion while maintaining the optical delay from one side of the pulse to the other.

In addition, these techniques to reduce the speckle contrast can be used in combination with other speckle reduction techniques to further reduce the speckle. Two examples of such techniques are a light pipe and a lens array. A light pipe or lens array spatially divides an input beam into multiple beamlets. Each of these beamlets then overlaps at the output of the light pipe or lens array. If the spatial or temporal coherence of the input pulse is sufficient so that one beamlet does not interfere with another, speckle contrast can be reduced.

Further, the method described herein for creating multiple pulses from a single pulse effectively increases the repetition rate of a repetitively pulsed source. The method described herein for reducing the speckle contrast from a single pulse using a grating to delay one side of a pulse with respect to the other side effectively increases the pulse length in time. Using both of these techniques in combination may produce a continuous or nearly continuous source from a high repetition rate source.

These and other objects and advantages of the present invention will become apparent to those skilled in the art from the following detailed description of the invention and the accompanying drawings.

DESCRIPTION OF THE DRAWINGS

FIG. 5a is a delay arrangement employing a single image relay lens;

FIG. 5b illustrates a delay arrangement having two image relay lenses;

DETAILED DESCRIPTION OF THE INVENTION

The present invention is a system and method for reducing peak power and speckle contrast in an imaging system employing a pulsed illumination source. The system uses multiple beam splitters in an arrangement that has the ability in many environments to minimize the energy variation between pulses. This system allows for a flexible setup where various combinations of plate beamsplitters and cube beamsplitters in different arrangements and geometries may be used while still within the scope of the teachings of the current invention.

In typical pulsed illumination source inspection systems, optical delay lines can be a major source of losses. The losses in the delay arms result from imperfect optics such as mirrors having less than 100% reflectivity, beamsplitters with loss and unequal beamsplit ratios, absorption of light energy in glass materials and coatings, and light energy scattering effects. These optical delay line losses adversely contribute to variations in the pulse-to-pulse energy unless a method of compensation is used. In the present invention, components are introduced between the beamsplitters to compensate for losses in the beamsplitters, mirrors, and optical delay lines. The net result is that the pulse energies are much more uniform. High efficiency within the system minimizes the required introduction of compensating losses.

Figure 1:
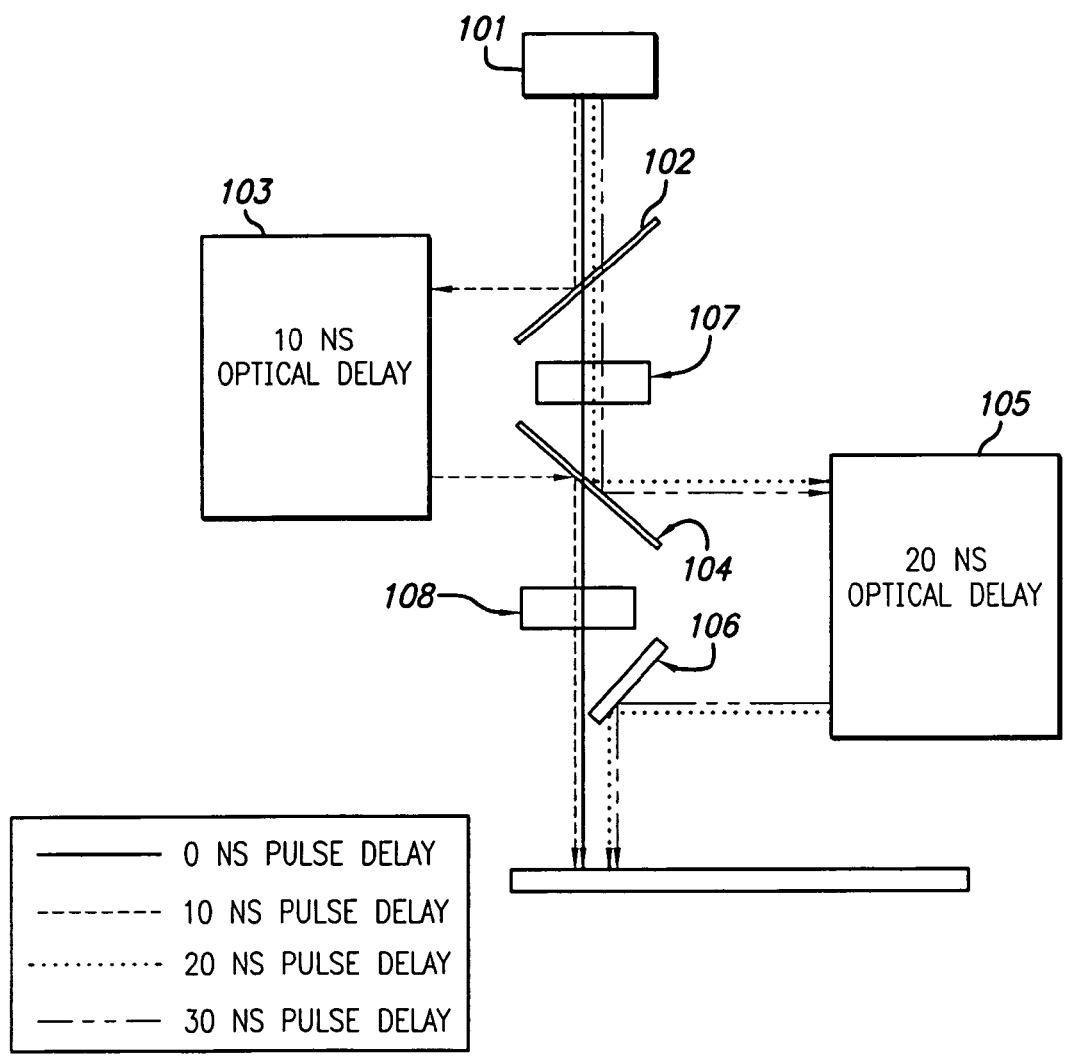
FIG. 1 illustrates an embodiment of the design used to reduce the peak power of a laser pulse, and one that can be altered by varying the angles of the components to reduce speckle contrast for a single laser pulse.

A schematic of an embodiment of a scheme to generate four pulses is shown in FIG. 1. From FIG. 1, light energy is initially generated by light emission source 101. The light energy is shown as four separate beams to more clearly illustrate the formation of four separate pulses. In most real situations only a single light beam would originate from the light source. The light energy from light emission source 101 is a pulsed light source. Light is transmitted toward beamsplitter 102, which splits the light energy. The pulse that is reflected by beamsplitter 101 is directed to the 10 ns optical delay 103, and beamsplitter 104. Beamsplitter 104 may again either split the beam or permit the beam to pass through. If it passes through, it is directed to the 20 ns optical delay 105, mirror 106, and to the specimen. In the case of the pulsed light energy passing through beamsplitter 102, said light energy contacts loss compensator 107 and subsequently passes to beamsplitter 104. Loss compensator 107 compensates for imperfect optical components such as the beamsplitter 102 or loss in optical delay 103. In this manner, light energy reflected by beamsplitter 102 contacts beamsplitter 104 at the same or nearly the same energy as light energy passing through beamsplitter 102 and loss compensator 107. Similarly, light energy from beamsplitter 104 that passes through loss compensator 108 strikes the sample surface at approximately the same energy as light passing the 20 ns optical delay 105 and mirror 106. If the light from source 101 is polarized, mirror 106 could be replaced by a waveplate and polarizing beamsplitter. In this manner the beams can be easily co-aligned. This mechanization provides for varying delays of the pulsed light energy such that light energy strikes the specimen surface at a desired time with relatively uniform energies.

The design presented in FIG. 1 generates four pulses each delayed by a different amount of time. The pulse passing directly through both beamsplitters has no delay introduced, while deflecting off both beamsplitters introduces a 10 nanosecond delay. 20 and 30 nanosecond delays can also be introduced in this arrangement as shown. This introduction of delay reduces the peak power of the pulses contacting the specimen surface.

Figure 2B:
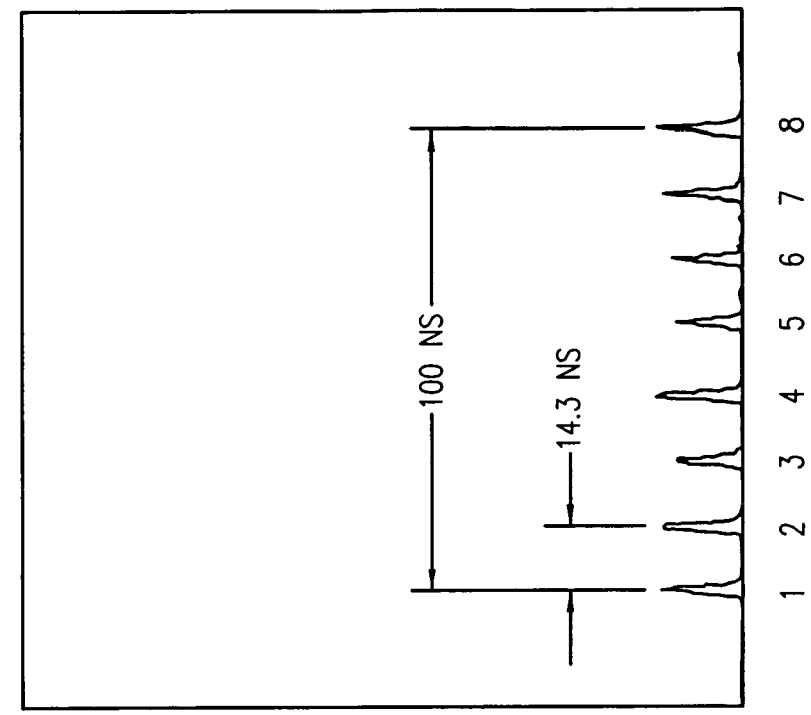
FIG. 2b is a plot of the intensity of multiple pulses, specifically eight pulses, resulting from the use of the system and method similar to the one illustrated in FIG. 1.
Figure 2A:
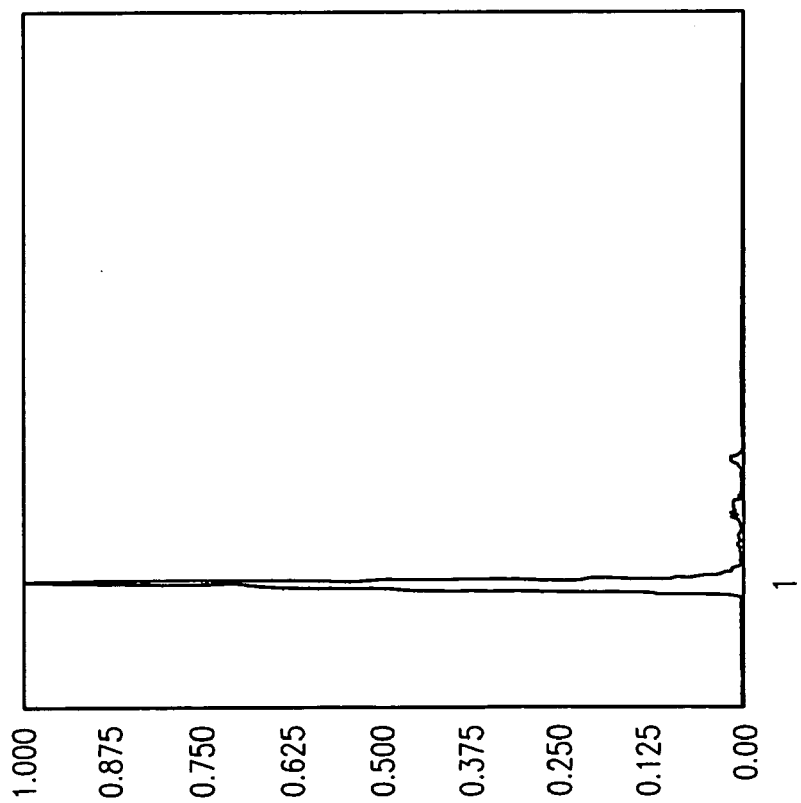
FIG. 2a shows a plot of the intensity of a single pulse.

The effects of using a design similar to the one illustrated in FIG. 1 are illustrated in FIGS. 2a and 2b. The system used to generate the pulses in FIG. 2b is capable of producing eight pulses delayed by varying amounts of time. In FIG. 2a, a 532 nm laser pulse is delivered to the specimen surface. The magnitude of the energy striking the surface is 100 percent. FIG. 2b shows the multiple pulses delivered to the surface, wherein the spacing between pulses is 14.2 nanoseconds, and eight pulses are delivered in 100 nanoseconds. The magnitude of the pulses delivered is on the order of 12.5 per cent. Thus rather than exposing the surface with a single large energy pulse, the surface is contacted by multiple smaller pulses.

A scheme to create multiple pulses from a single pulse poses problems with producing a uniform energy for the multiple pulses. This is especially true when a large number of pulses or long delays are required. In addition, maintaining uniform pulse amplitudes is further complicated in the UV-DUV portion of the spectrum. Optical losses tend to be very high because of increased absorption, less efficient AR and HR coatings, and increased scattering. However, even efficient optical systems can still suffer significant differences in pulse energies. In this scheme, compensators are used to add additional losses, similar to those produced by the beamsplitters, mirrors, optical delay lines, and so forth, in order to make the pulse energy uniform.

Many different schemes can be used for compensation. A common technique is to use attenuation in the form of reflective or absorbing filters. The appropriate filters can be used to compensate for the losses and make the pulse energies uniform. Continuously variable filters are available that allow exact matching. In addition, other techniques can be used, such as employing a polarization based attenuator when using polarized light.

The optical delay line is an important component of the present system. Imaging relays or stable optical cavities are preferred because they maintain the beam profile and stability over long optical delay paths. Many of these schemes are commonly known in the industry. Reflective cavities such as White cells, Herriott cells, or other reflective multipass cells are typical examples. One major problem with these type of multipass cells is they can be very inefficient. If long optical delays are necessary, many cavity round trips will be required with many mirror reflections. In the DUV-VUV spectral range, where mirror coatings may not be highly reflective, the efficiency of an all reflective optical delay line may be unacceptable. For this reason it is desirable to employ optical delay schemes that minimize losses.

Figure 3:
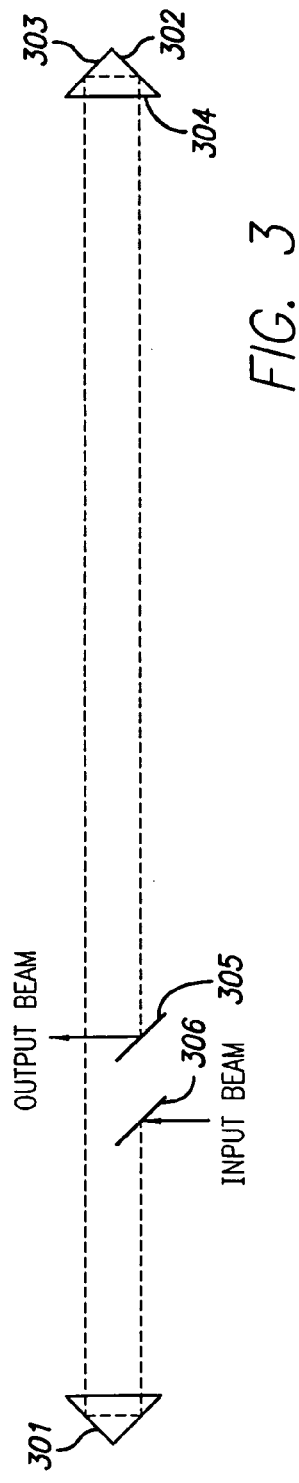
FIG. 3 is a delay arrangement using two prisms, each prism including a TIR surface and an AR surface.

In the DUV-VUV spectral region, antireflection coatings are typically more efficient than HR coatings. In addition, interfaces at Brewster's angle and TIR surfaces can have extremely low loss. The present design allows the use of novel optical delay schemes that can utilize Brewsters angle surfaces, TIR surfaces and transmissive surfaces that can be AR coated to greatly enhance the efficiency of the optical delay scheme. One such novel optical delay scheme utilizing these types of surfaces is illustrated in FIG. 3. The system of FIG. 3 utilizes two prisms, left prism 301 right prism 302, having total internal reflections and an AR coated surface as an optical delay mechanism. This arrangement has the additional advantage that the optical delay can be tuned simply by rotating the prisms about their common axis. From FIG. 3, the light beam is introduced into the arrangement and is deflected by a mirror 306 to left prism 301, which directs light outward toward right prism 302. Right prism 302 has two TIR (total internal reflection) surfaces 303 and an AR (anti-reflective) surface 304 for directing the beam back toward left prism 301. After a single pass through the arrangement, light energy exits the arrangement, shown as the output beam in FIG. 3, using mirror 305 to direct the light energy outward. Additional methods can be used to direct the input and output beams. Examples of these methods include a single mirror using the front surface for the input and the rear surface for the output, or a prism using TIR and AR surfaces in much the same manner as prism 301 and 302. In addition, the input and output beams can be located in a variety of positions within the cavity to suit the particular application. This produces the necessary delay for the system in an efficient manner. As may be appreciated, the desired time of the delay directly affects the spacing between the various components.

Figure 4:
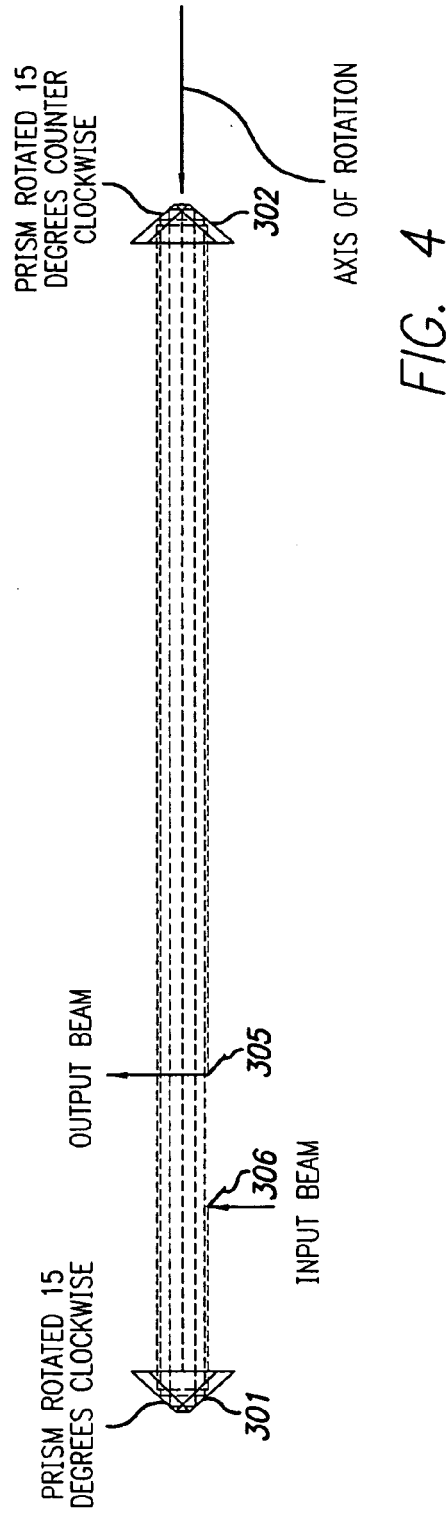
FIG. 4 illustrates two prisms rotated such that light energy entering makes a total of six round trips between prisms, thereby increasing overall delay time.

Further delays may be obtained by creating multiple trips between the reflecting surfaces prior to passing the light energy out of the arrangement. The increase in delay by rotation of the left prism 301 and right prism 302 are shown in FIG. 4. The arrangement shown in FIG. 4 has the limitation that the beam is not re-imaged as it passes back and forth between the prisms. An image relay can be added to the arrangement of FIG. 4 by placing a lens or lenses between the prisms. Addition of a lens or lenses provides for re-imaging such that an image may be retrieved and processed at varying points in the design, thus providing increased control over the quality of the image received. An imaging relay can be inserted in the optical delay arrangement as shown in FIG. 5a. This optical delay improves the stability and maintain the beam size for long optical delays. An image relay example using two lenses in an a focal telescope arrangement is shown in FIG. 5b. Alternately, one or more prism surface can be curved to act as a lens, in the case of an AR surface, or a curved mirror, in the case of a TIR surface, for purposes of re-imaging the light.

Figure 6:
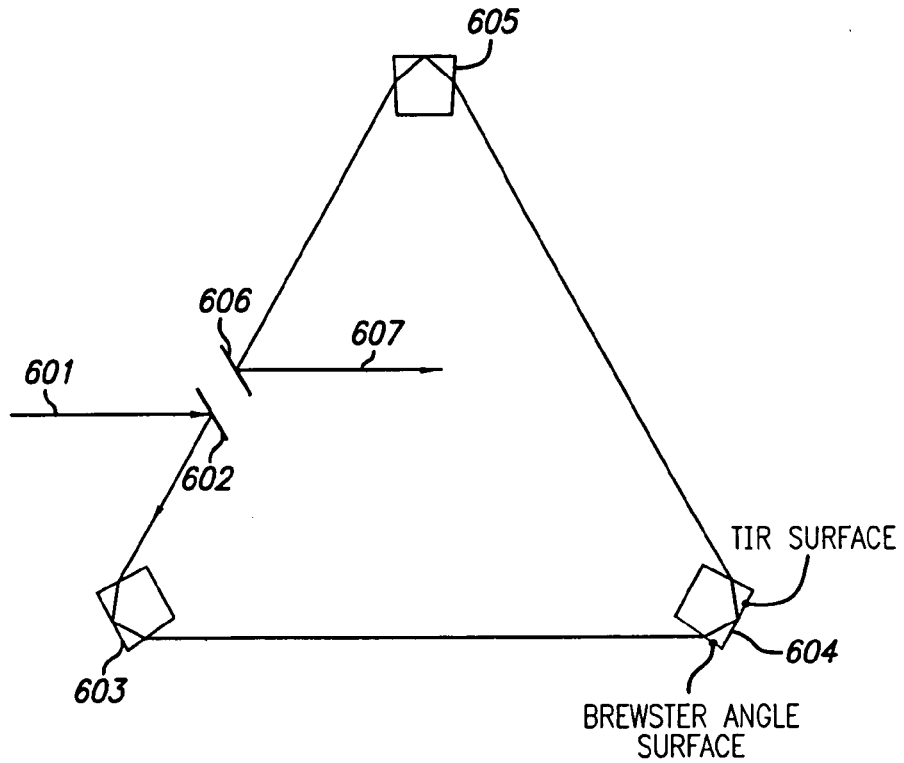
FIG. 6 presents a delay arrangement wherein three prisms are used each having a TIR surface and incorporating a Brewster's angle surface.

Novel optical delay schemes utilizing TIR and Brewster's angle surfaces are also possible. One such optical delay geometry is shown in FIG. 6. From FIG. 6, input beam 601 is directed into the arrangement and redirected using a mirror 602 toward first prism 603. First prism 603 directs the received beam toward second prism 604, which directs the beam toward third prism 605. Each prism has a TIR surface and two Brewster angle surfaces to efficiently deflect and transmit the light energy. Once light energy is reflected by third prism 605, it is output as output beam 607 from the arrangement using a mirror 606. A lens or lenses can also be added to this geometry to re-image the light, either in the path of the light or at the entrance or exit of one of the prisms. Multiple round trips can be achieved by providing a small angle of the beam out of the plane of the drawing in FIG. 6. This will cause the beam to walk down the surfaces of the prisms with each round trip.

The system further includes the ability to reduce speckle effects in transmitted and received light. It can be shown that when a laser beam enters a diffuser at a different angle, the speckle pattern of the light energy leaving the diffuser also changes. This change in speckle pattern for different angles enables generation of multiple speckle patterns by multiple beams at multiple angles when light energy passes through a diffuser. These speckle patterns can be integrated together to reduce the speckle contrast. However, in order for integration to function properly, each speckle pattern must arrive at the detector at slightly different times. Varying arrival times of speckle patterns can be achieved by using the same optical apparatus previously described to reduce the peak power of a laser pulse. The optical apparatus, such as that illustrated in FIG. 1, generates multiple pulses separated in time from a single input pulse.

Figure 7:
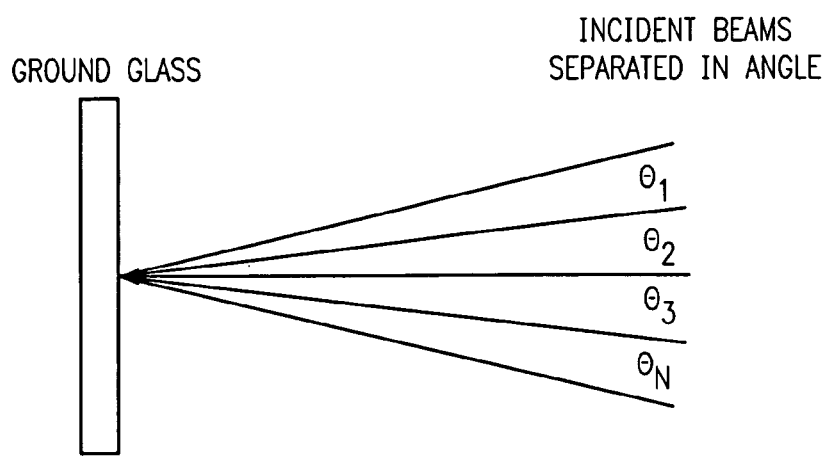
FIG. 7 is a preferred angular arrangement of pulses to apply to ground glass to reduce speckle contrast in accordance with the invention herein and the design of FIG. 1.
Figure 8:
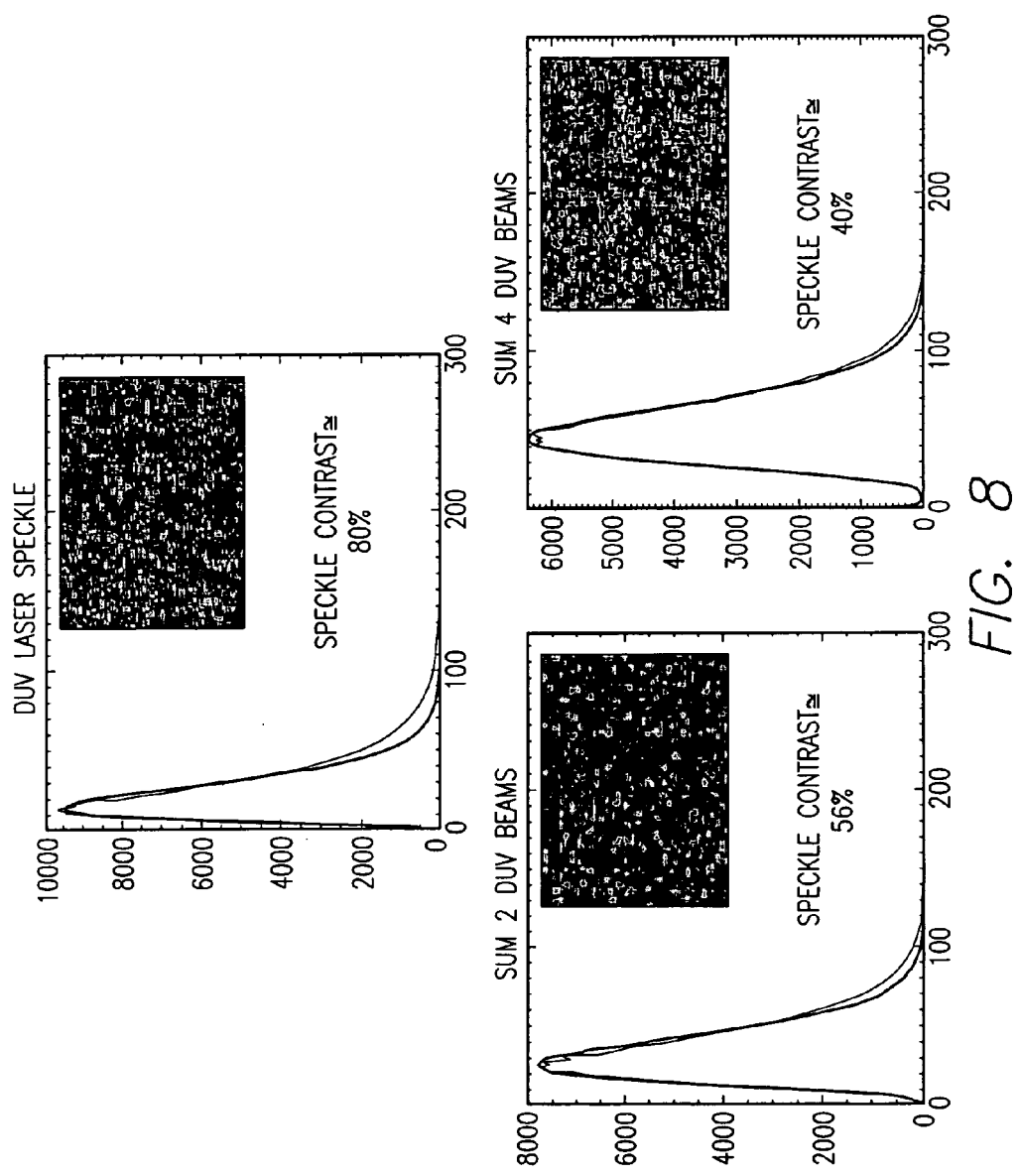
FIG. 8 shows the results of a standard laser pulse, the use of two DUV pulses, and four DUV pulses and the associated speckle contrasts.

The difference between using the system illustrated in FIG. 1 for reducing peak power and using the system to reduce speckle contrast is the alignment of the optical apparatus. Typically, when multiple pulses are generated to reduce the peak power of a single pulse, all the optical paths are co-aligned to have the same optical axis and the same beam position at the exit of the optical apparatus. However, for reducing the speckle contrast, it is desirable to have different angles between the different optical paths. Different angles are achieved by slightly changing the angles of the mirrors and beamsplitters in the optical apparatus. This angular change produces different angles between each output pulse as the pulse exits the optical apparatus and enters the diffuser as shown in FIG. 7. The result of using two and four pulses to reduce the contrast of a speckle pattern is shown in FIG. 8. From FIG. 8, a typical DUV laser arrangement without the implementation of FIG. 1 having varying angles between optical paths produces a speckle contrast of 80 percent. Use of the implementation of FIG. 1 may entail, for example in a 2 DUV beam arrangement, light energy being directed through the beamsplitters and loss compensators for one channel, i.e. the 0 ns loss leg of FIG. 1, as well as the 10 ns path. Such an implementation requires redirecting at least one path of light energy, such as the energy emitting from the 10 ns delay path, so as to contact the surface at an angle different from the 0 ns energy path in a manner as demonstrated in FIG. 7, i.e. at an offset angle from the 0 ns path. Using this type of implementation, speckle contrast may be reduced to on the order of 56 percent. Use of four separate and summed DUV beams, such as all four paths illustrated in FIG. 1, reduces the speckle contrast to on the order of 40 percent.

One problem with this scheme is that diffusers are not efficient. In the arrangement illustrated in FIG. 1, a phase plate may be inserted in the system instead of a diffuser to increase efficiencies. Phase plates with multiple levels or continuous profiles can provide efficiencies approaching 100%.

Figure 9:
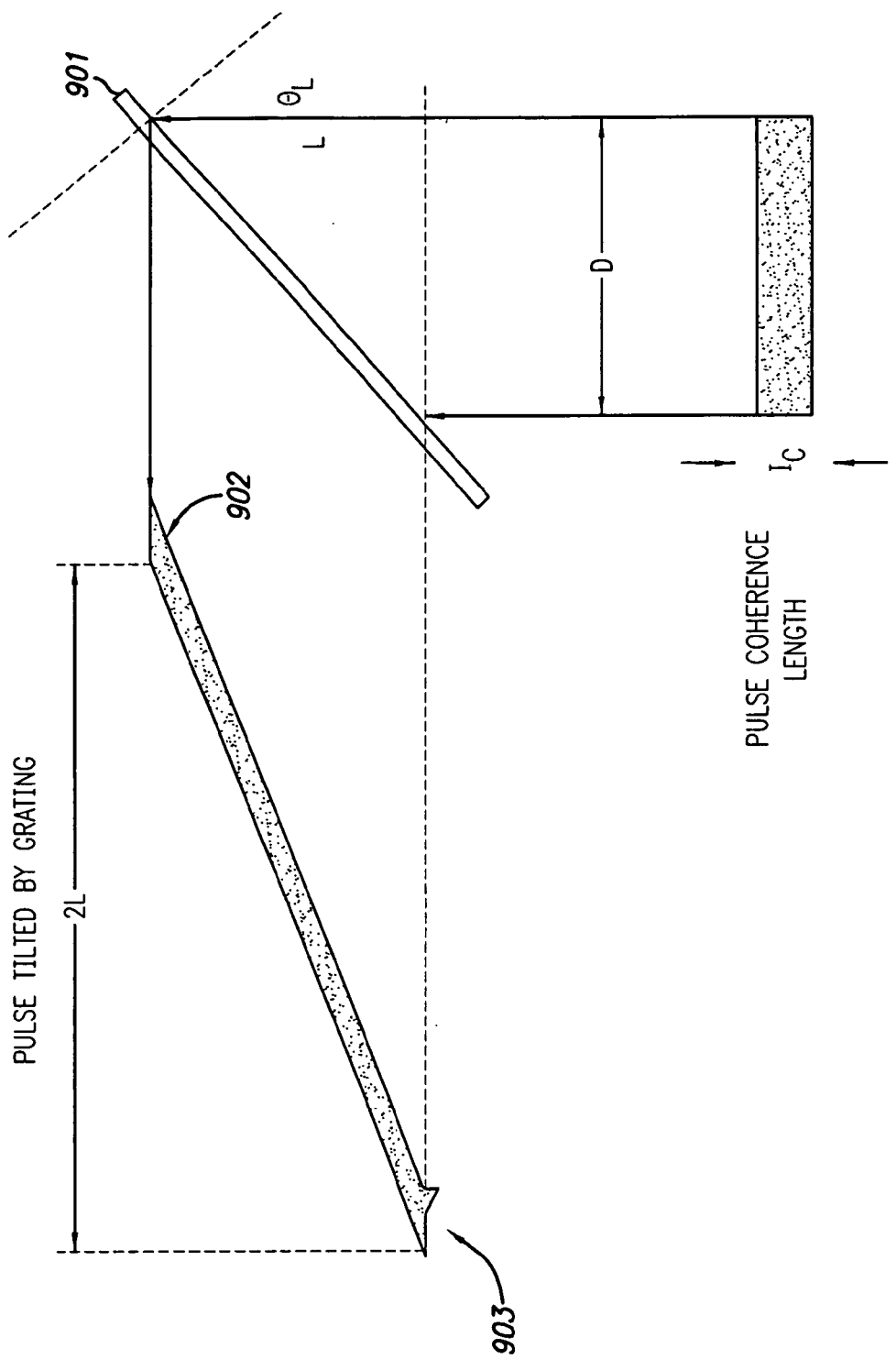
FIG. 9 is an alternate embodiment of the method and apparatus for reducing speckle contrast employing a diffraction grating.

The second method for reducing speckle contrast using a single pulse employs a grating to produce an optical delay from one side of the pulse to the other. The use of a grating to delay a portion of the pulse is illustrated in FIG. 9. Grating 901 causes one side of the laser wavefront to be delayed in time. This delay caused by grating 901 changes across the beam making the wavefront tilt in time. In FIG. 9, the wave emanates from the light generating device (not shown) at the bottom of the illustration. The pulse has a diameter D and in the arrangement shown the left portion of the beam strikes the grating 901 and is redirected by the grating 901 before the right half of the pulse strikes the grating. The distance covered in a fixed period of time is the same for the right and left side of the pulse, and thus by the time the right side of the pulse reaches location 902, the left side of the pulse has reached location 903. From the illustration, the right side of the pulse covers an additional distance L before striking grating 901. The illustration shows an approximate 45 degree angle between the pulse and grating 901, but in practice other angles could be employed while still within the scope of the invention. In the illustrated 45 degree angle case, the right side of the pulse covers a distance that is ultimately 2 L shorter than the distance covered by the left side of the pulse. This differential in time or in distance covered produces a differential akin to the delay produced by the implementation of FIG. 1. The resultant tilted wavefront can be used in combination with a diffuser or phase plate to reduce the speckle contrast.

Figure 10:
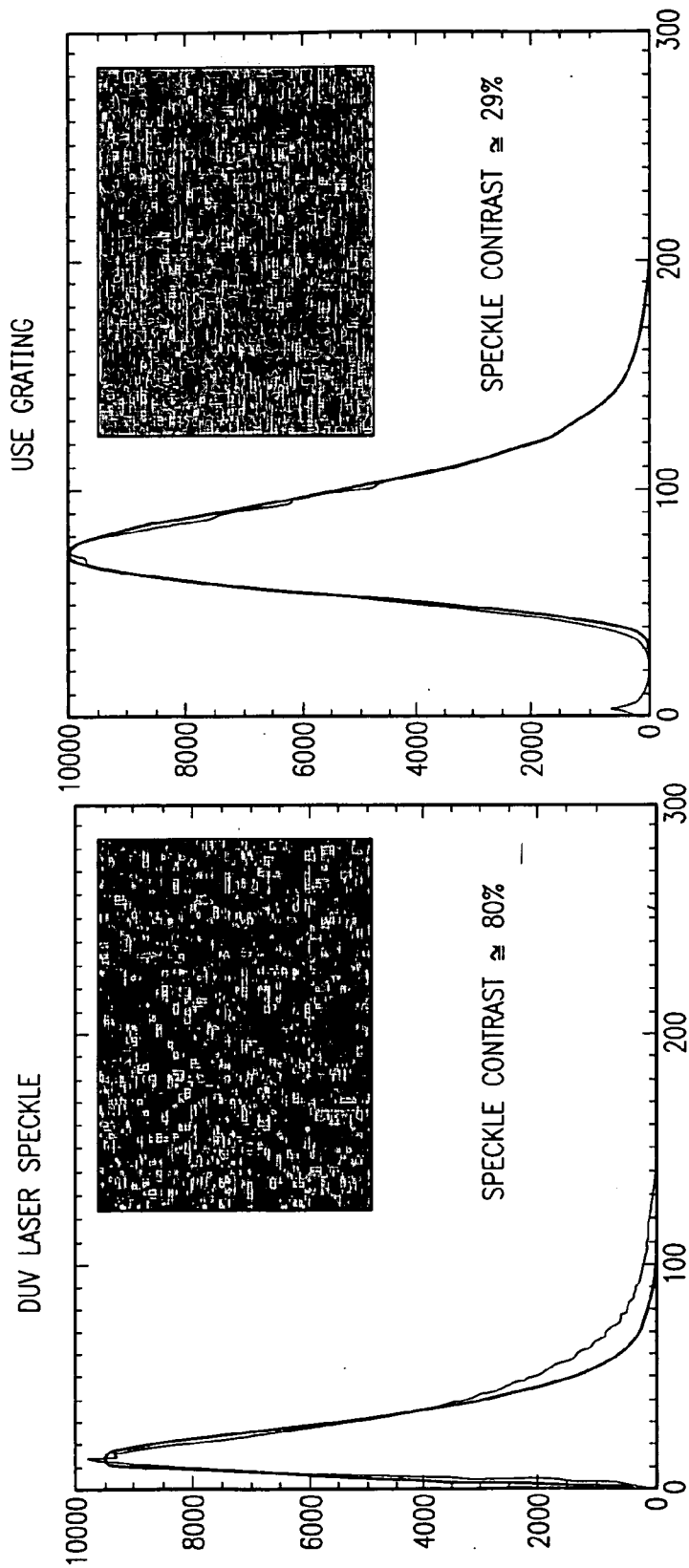
FIG. 10 is the resultant speckle contrast of the grating arrangement used in FIG. 9.

From FIG. 9, the initial laser pulse will have a well defined coherence length. After the pulse passes through grating 901 one side of the pulse is delayed and the coherence length remains the same. The right side of the pulse is delayed with respect to the left side by:

Delay=2L=2D tan $\theta_i$ where D is the diameter of the input beam and $\theta_i$ is the diffraction angle. This mechanization effectively breaks up the pulse into many independent sections that do not interfere with each other. These independent sections combine in intensity to reduce the speckle contrast. The number of independent sections is equal to:

$$\text{Sections} = \frac{2L}{l_c}$$

where 2 L is the maximum delay and $l_c$ coherence length. The result of the use of a grating such as that presented in FIG. 9 to reduce the contrast of a speckle pattern in shown in FIG. 10. From FIG. 10, speckle contrast may be reduced from 80 percent for a single pulse to 29 percent using a grating as shown in FIG. 9.

Figure 11:
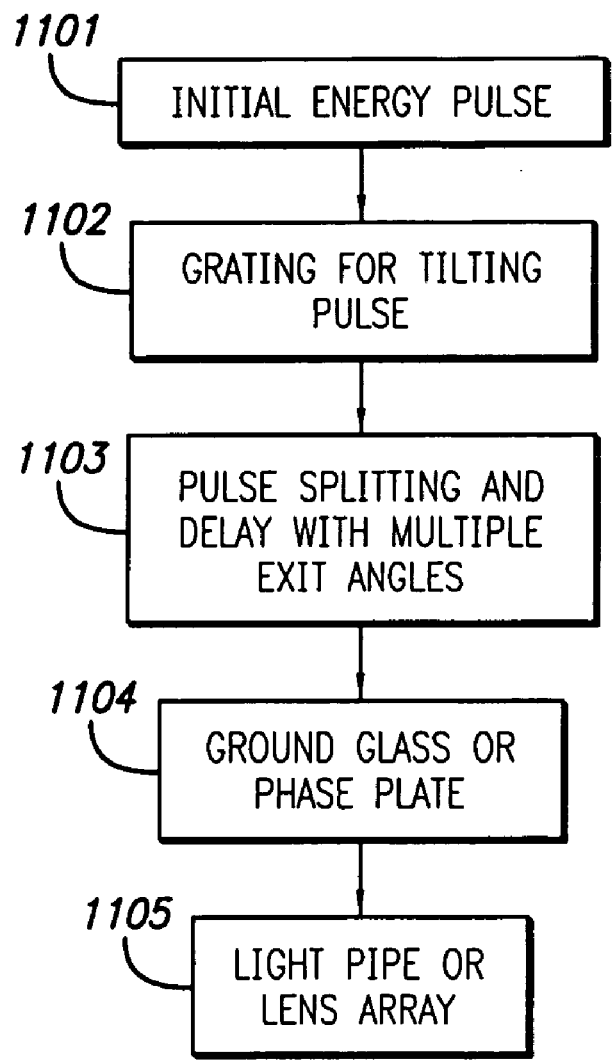
FIG. 11 illustrates a functional diagram of the elements used in a device that reduces peak power and speckle contrast.

Speckle reduction techniques using the implementation of FIG. 1 and that of FIG. 8 may be used in combination to further reduce speckle contrast. In addition, the use of optical delays and gratings or other redirectional or delaying elements can be used in combination with a light pipe or lens array to produce an ideal uniform illumination source with low peak power and low speckle contrast. FIG. 11 illustrates the operation and elements in a system for reducing speckle contrast. Step 1101 involves generating the initial laser pulse. Step 1102 provides for tilting the pulse using a grating such as the grating 901 presented in FIG. 9. Step 1103 comprises splitting the pulse received from the grating and delaying the pulse using multiple exit angles. Step 1104 indicates passage of the varying angle and delayed pulses through ground glass or phase plates and subsequently passing the received light energy to a light pipe or lens array in step 1105. Other combinations of the pulse delay or dividing and combining techniques disclosed herein are possible while still within the course and scope of the invention.

The system and method described for creating multiple pulses from a single pulse effectively increases the repetition rate of a repetitively pulsed source. For example, if a 2 kHz excimer laser is used in combination with the system designed to create four pulses as described in FIG. 1, the repetition rate is increased to 8 kHz. In addition, the system and method described for reducing the speckle contrast from a single pulse using a grating to delay one side of a pulse with respect to the other side effectively increases the pulse length in time. It is therefore conceivable that by using both of these techniques in combination, a continuous or nearly continuous source can be produced from a high repetition rate source. To illustrate this, assume a laser operating at 80 MHz with a 100 ps pulse width is used in combination with a system, similar to that described in FIG. 1, designed to create 32 pulses with the appropriate delays, the repetition rate is effectively increased to 2.6 GHz. The pulse separation of the 2.6 GHz source is around 400 Ps. Now if the 100 Ps pulse can be stretched to 400 ps, the source can be considered continuous. Using a grating at a symmetric 45 degree angle, the 100 Ps pulse can be stretched to 400 Ps using a beam 2.4 inches in diameter. One potential problem with this approach is the spectral dispersion created by the grating. This can be eliminated by adding a second grating. This second grating eliminates the spectral dispersion while maintaining the optical delay from one side of the pulse to the other.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A system for reducing speckle contrast in a single laser pulse, comprising:
   a plurality of beamsplitters oriented to receive said laser pulse and split said laser pulse into a plurality of laser pulses; and
   a plurality of optical delay elements oriented to delay at least one of said plurality of pulses, wherein said optical delay elements cause said plurality of laser pulses to contact a target at predetermined relative times;
   wherein said beamsplitters and optical delay elements are oriented to provide said plurality of pulses to said target at varying angular offsets.

2. The system of claim 1, wherein:
   said at least one beamsplitter comprises two beamsplitters; and
   said plurality of optical delay elements comprises five reflective surfaces; and
   wherein said arrangement is oriented to cause four pulses to strike said target at different times.

3. The system of claim 1, wherein said optical delay elements comprise at least one TIR surface and at least one AR (antireflective) surface.

4. The system of claim 1, wherein said optical delay elements comprises at least one reflective surface oriented to utilize Brewster's angle.

5. The system of claim 1, wherein said system causes four pulses to contact said target at four different times.

6. The system of claim 1, wherein said optical delay elements comprises a plurality of prisms for receiving light energy and redirecting light energy in a predetermined manner thereby causing delay of application of said pulses to said target.

7. The system of claim 1, wherein said beamsplitters redirect said laser pulses toward said optical delay elements, and wherein said optical delay elements are positioned varying distances from said beamsplitters to vary delay of said laser pulses.

8. The system of claim 1, wherein said at least one optical delay element comprises at least one reflective surface oriented to utilize Brewster's angle.

9. A system for reducing speckle contrast during inspection of a target, comprising:
   at least one beamsplitter oriented to receive an energy pulse and split said energy pulse into a plurality of energy pulses; and
   at least one optical delay element oriented to delay at least one of said plurality of energy pulses;
   wherein each beamsplitter and optical delay element is oriented to provide said plurality of pulses to the target at different times and varying angular offsets, thereby reducing speckle contrast of an image of the target.

10. The system of claim 9, wherein each optical delay element is staggered in distance from a corresponding beamsplitter, thereby producing a staggered set of time delays for each pulse directed toward one beamsplitter.

11. The system of claim 10, wherein said at least one optical delay elements comprises a plurality of reflective surfaces.

12. The system of claim 9, wherein said at least one optical delay elements comprises a plurality of reflective surfaces.

13. The system of claim 9, wherein said at least one optical delay element comprises at least one TIR surface and at least one AR (antireflective) surface.

14. A speckle contrast reduction system, comprising:
   a plurality of beamsplitters oriented to receive a laser pulse and split said laser pulse into a plurality of laser pulses; and
   a plurality of optical delay elements oriented to delay at least one of said plurality of pulses and further oriented to provide the plurality of pulses to a target, wherein said optical delay elements cause said plurality of laser pulses to contact the target at predetermined relative times, said plurality of optical elements comprising at least one optical element having at least one total internal reflection (TIR) surface.

15. The system of claim 14, wherein:

said at least one beamsplitter comprises two beamsplitters; and said at least one optical delay elements comprises five reflective surfaces; and wherein said arrangement is oriented to cause four pulses to strike said target at different times.

16. The system of claim 14 wherein said optical delay elements comprise at least one AR (antireflective) surface.

17. The system of claim 14, wherein said optical delay elements comprises at least one reflective surface oriented to utilize Brewster's angle.

18. The system of claim 14, wherein said system causes four pulses to contact said target at four different times.

19. The system of claim 14, wherein said optical delay elements comprises a plurality of prisms for receiving light energy and redirecting light energy in a predetermined maimer thereby causing delay of application of said pulses to said target.

20. The system of claim 14, wherein said beamsplitters redirect said laser pulses toward said optical delay elements, and wherein said optical delay elements are positioned varying distances from said beamsplitters to vary delay of said laser pulses.

* * * * *